(12) United States Patent
Ritenour

(10) Patent No.: US 8,988,097 B2
(45) Date of Patent: Mar. 24, 2015

(54) METHOD FOR ON-WAFER HIGH VOLTAGE TESTING OF SEMICONDUCTOR DEVICES

(71) Applicant: RF Micro Devices, Inc., Greensboro, NC (US)

(72) Inventor: Andrew P. Ritenour, Colfax, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 29 days.

(21) Appl. No.: 13/914,060

(22) Filed: Jun. 10, 2013

(65) Prior Publication Data

US 2014/0057372 A1    Feb. 27, 2014

Related U.S. Application Data

(60) Provisional application No. 61/693,101, filed on Aug. 24, 2012.

(51) Int. Cl.
   *G01R 31/26* (2014.01)
   *H01L 21/66* (2006.01)

(52) U.S. Cl.
   CPC ..................................... *H01L 22/14* (2013.01)
   USPC .................................................... 324/762.05

(58) Field of Classification Search
   CPC ..... H01L 2224/94; H01L 24/11; H01L 24/03; H01L 2224/11; H01L 2224/83; H01L 21/76846; H01L 2224/05558; H01L 2224/05562
   USPC .......... 324/762.01–762.1; 257/48; 438/14–18
   See application file for complete search history.

(56) References Cited

U.S. PATENT DOCUMENTS

| | | | |
|---|---|---|---|
| 4,317,055 | A | 2/1982 | Yoshida et al. |
| 4,540,954 | A | 9/1985 | Apel |
| 4,543,535 | A | 9/1985 | Ayasli |
| 4,620,207 | A | 10/1986 | Calviello |
| 4,788,511 | A | 11/1988 | Schindler |
| 5,028,879 | A | 7/1991 | Kim |
| 5,046,155 | A | 9/1991 | Beyer et al. |

(Continued)

FOREIGN PATENT DOCUMENTS

| | | |
|---|---|---|
| EP | 1187229 A1 | 3/2002 |
| EP | 1826041 A1 | 8/2007 |

(Continued)

OTHER PUBLICATIONS

Non-Final Office Action for U.S. Appl. No. 13/927,182, mailed May 1, 2014, 7 pages.

(Continued)

*Primary Examiner* — Tung X Nguyen
(74) *Attorney, Agent, or Firm* — Withrow & Terranova, P.L.L.C.

(57) ABSTRACT

A method for wafer high voltage testing of semiconductor devices is disclosed. The method involves adding a patterning layer onto a passivation layer of the semiconductor devices and then etching vias through the passivation layer to expose conductive test points. Testing of the semiconductor devices begins with engaging the conductive test points with high voltage test probes of a testing apparatus and then applying a high voltage test sequence to the conductive test points via the high voltage test probes. The testing of the semiconductor devices concludes by disengaging the high voltage test probes from a last one of the semiconductor devices and then removing the patterning layer from the passivation layer of the semiconductor devices.

20 Claims, 3 Drawing Sheets

(56) References Cited

U.S. PATENT DOCUMENTS

| | | | |
|---|---|---|---|
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A * | 1/1999 | Juengling ................ 257/306 |
| 5,874,747 A | 2/1999 | Redwing et al. |
| 5,880,640 A | 3/1999 | Dueme |
| 5,914,501 A | 6/1999 | Antle et al. |
| 5,949,140 A | 9/1999 | Nishi et al. |
| 6,049,250 A | 4/2000 | Kintis et al. |
| 6,064,082 A | 5/2000 | Kawai et al. |
| 6,110,757 A | 8/2000 | Udagawa et al. |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,448,793 B1 | 9/2002 | Barratt et al. |
| 6,455,877 B1 | 9/2002 | Ogawa et al. |
| 6,475,916 B1 | 11/2002 | Lee et al. |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,211,822 B2 | 5/2007 | Nagahama et al. |
| 7,408,182 B1 | 8/2008 | Smart et al. |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,405,068 B2 | 3/2013 | O'Keefe |
| 8,502,258 B2 | 8/2013 | O'Keefe |
| 8,633,518 B2 | 1/2014 | Suh et al. |
| 8,692,294 B2 * | 4/2014 | Chu et al. ................ 257/194 |
| 8,785,976 B2 | 7/2014 | Nakajima et al. |
| 2001/0054848 A1 | 12/2001 | Baudelot et al. |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0241916 A1 | 12/2004 | Chau et al. |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2006/0043385 A1 | 3/2006 | Wang et al. |
| 2006/0068601 A1 | 3/2006 | Lee et al. |
| 2006/0124960 A1 | 6/2006 | Hirose et al. |
| 2006/0243988 A1 | 11/2006 | Narukawa et al. |
| 2007/0093009 A1 | 4/2007 | Baptist et al. |
| 2007/0295985 A1 | 12/2007 | Weeks, Jr. et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2010/0025657 A1 | 2/2010 | Nagahama et al. |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |

(56) References Cited

U.S. PATENT DOCUMENTS

| | | |
|---|---|---|
| 2010/0230717 A1 | 9/2010 | Saito |
| 2010/0258898 A1 | 10/2010 | Lahreche |
| 2011/0017972 A1 | 1/2011 | O'Keefe |
| 2011/0095337 A1 | 4/2011 | Sato |
| 2011/0101300 A1 | 5/2011 | O'Keefe |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0126240 A1 | 5/2012 | Won |
| 2012/0199875 A1 | 8/2012 | Bhalla et al. |
| 2012/0211802 A1 | 8/2012 | Tamari |
| 2012/0218783 A1 | 8/2012 | Imada |
| 2012/0262220 A1 | 10/2012 | Springett |
| 2013/0277687 A1 | 10/2013 | Kobayashi et al. |
| 2013/0280877 A1 | 10/2013 | Kobayashi et al. |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Non-Final Office Action for U.S. Appl. No. 13/973,482, mailed May 23, 2014, 8 pages.

Non-Final Office Action for U.S. Appl. No. 13/795,986, mailed Apr. 24, 2014, 13 pages.

Chang, S.J. et al, "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN—GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Notice of Allowance for U.S. Appl. No. 10/620,205, mailed Dec. 8, 2005, 4 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 12/841,225 mailed Dec. 22, 2011, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Notice of Allowance for U.S. Appl. No. 12/841,225, mailed Nov. 9, 2012, 5 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Non-Final Office Action for U.S. Appl. No. 12/841,257 mailed Jan. 5, 2012, 13 pages.

Advisory Action for U.S. Appl. No. 11/937,207, mailed Feb. 2, 2010, 2 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

Non-Final Office Action for U.S. Appl. No. 11/458,833, mailed Apr. 1, 2008, 10 pages.

Notice of Allowance for U.S. Appl. No. 11/458,833, mailed Mar. 9, 2009, 7 pages.

Invitation to Pay Fees for PCT/US2013/056105, mailed Nov. 5, 2013, 7 pages.

International Search Report and Written Opinion for PCT/US2013/056126, mailed Oct. 25, 2013, 10 pages.

International Search Report and Written Opinion for PCT/US2013/056132, mailed Oct. 10, 2013, 11 pages.

International Search Report and Written Opinion for PCT/US2013/056187, mailed Oct. 10, 2013, 11 pages.

International Search Report for GB0902558.6, issued Jun. 15, 2010, by the UK Intellectual Property Office, 2 pages.

Examination Report for British Patent Application No. 0902558.6, mailed Nov. 16, 2012, 5 pages.

Examination Report for British Patent Application No. GB0902558.6, issued Feb. 28, 2013, 2 pages.

Non-Final Office Action for U.S. Appl. No. 12/705,869, mailed Feb. 9, 2012, 10 pages.

Notice of Allowance for U.S. Appl. No. 12/705,869, mailed Apr. 4, 2013, 9 pages.

(56) References Cited

OTHER PUBLICATIONS

Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
International Search Report and Written Opinion for PCT/US2013/056105, mailed Feb. 12, 2014, 15 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/966,400, mailed Sep. 3, 2014, 9 pages.
Non-Final Office Action for U.S. Appl. No. 13/957,698, mailed Nov. 5, 2014, 11 pages.
Final Office Action for U.S. Appl. No. 13/973,482, mailed Nov. 5, 2014, 9 pages.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Final Office Action for U.S. Appl. No. 13/910,202, mailed Jan. 20, 2015, 10 pages.
Final Office Action for U.S. Appl. No. 13/966,400, mailed Dec. 3, 2014, 8 pages.
Final Office Action for U.S. Appl. No. 13/795,986, mailed Dec. 5, 2014, 16 pages.

* cited by examiner

METHOD FOR ON-WAFER HIGH VOLTAGE TESTING OF SEMICONDUCTOR DEVICES

RELATED APPLICATIONS

This application claims the benefit of U.S. provisional patent application No. 61/693,101, filed Aug. 24, 2012, the disclosure of which is incorporated herein by reference in its entirety.

FIELD OF THE DISCLOSURE

The present disclosure relates to high voltage testing of semiconductor devices.

BACKGROUND

On-wafer parametric and Known Good Device (KGD) testing for high voltage devices can be challenging. Test voltages in excess of 600 V are typically applied to a wafer with semiconductor devices under test in order to measure leakage and/or breakdown voltage. Often high voltage ionization and breakdown of air or surface flashover will confound electrical measurements of the semiconductor devices' intrinsic device performance. For example, an electric field of around about 30 kV/cm will cause the air between features of a semiconductor device to ionize, which will usually allow a destructive energy flow into the semiconductor device. Fortunately, electric field levels for materials making up semiconductor devices typically exceed 30 kV/cm. Thus, high voltage semiconductor devices are packaged such that an ionization of air to the point of breakdown is prevented. However, before packaging and during wafer testing an air ionization leading to a destructive voltage breakdown is an ever present risk for the semiconductor devices under test. Moreover, even non-destructive voltage breakdowns resulting from air ionization and/or flashover are not indicative of intrinsic device performance.

A common technique for suppressing air ionization and breakdown is to dispense a fluid having a relatively high dielectric strength onto a wafer having semiconductors to be tested. Examples of high dielectric strength fluids include fluorocarbon-based fluids such as perfluorohexane ($C_6F_{14}$). While suppressing air ionization and breakdown using high dielectric strength fluids is effective, it is also impractical for high volume production testing.

FIG. 1 depicts a cross-section of a prior art semiconductor device 10 before undergoing a prior art approach that involves depositing a relatively increased amount of a high dielectric strength material that makes up a passivation layer 12, that at least partially covers conductive features 14 and 16 to suppress air ionization. The semiconductor device 10 has a substrate 18 that carries epitaxial layers 20 onto which the conductive features 14 and 16 are disposed. The passivation layer 12 also covers a section of the epitaxial layers 20 that is between the conductive features 14 and 16.

High electric fields between the conductive features 14 and 16 can sometimes be confined to the passivation layer 12. However, a destructive breakdown may still occur if the layer thickness of the passivation layer 12 is not thick enough. In such a case, a thickening of the passivation layer 12 may be considered as illustrated in FIG. 2. However, there are practical limitations as to how thick the passivation layer 12 can be. For example, inorganic dielectrics like silicon nitride (SiN) are more prone to cracking as a function of increased thickness. A practical thickness for SiN is around about 1 µm, whereas a thickness approaching 5 µm is approaching impracticability. Moreover, if the passivation layer 12 is deposited using a relatively slow process such as atomic layer deposition (ALD), impracticalities of excessive time consumption and excessive cost are introduced for the deposition of material layers greater than 0.1 µm. Thus, a need remains for a high voltage on-wafer testing method for semiconductor devices in a high volume production environment.

SUMMARY

The present disclosure provides a method for on-wafer high voltage testing of semiconductor devices. The method involves adding a patterning layer onto a passivation layer of the semiconductor devices and then etching vias through the passivation layer to expose conductive test points. Testing of the semiconductor devices begins with engaging the conductive test points with high voltage test probes of a testing apparatus and then applying a high voltage test sequence to the conductive test points via the high voltage test probes. The testing of the semiconductor devices concludes by disengaging the high voltage test probes from a last one of the semiconductor devices and then removing the patterning layer from the passivation layer of the semiconductor devices.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure provides a method for on-wafer high voltage testing of semiconductor devices. The method involves adding a patterning layer onto a passivation layer of the semiconductor devices and then etching vias through the passivation layer to expose conductive test points. Testing of the semiconductor devices begins with engaging the conductive test points with high voltage test probes of a testing apparatus and then applying a high voltage test sequence to the conductive test points via the high voltage test probes. The testing of the semiconductor devices concludes by disengaging the high voltage test probes from a last one of the semiconductor devices and then removing the patterning layer from the passivation layer of the semiconductor devices. The patterning layer can be removed by any number of techniques known to those skilled in the art. For example, a common technique for removing the patterning layer is by chemical etching. Other techniques such as mechanical etching may also be employed.

Figure 3:
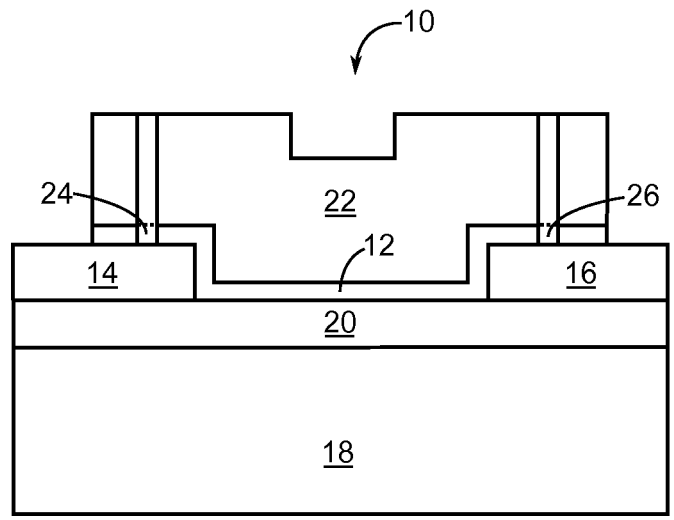
FIG. 3 is a cross-section view depicting the semiconductor device after preparation for on-wafer high voltage testing in accordance with the present disclosure.

FIG. 3 is a cross-section view depicting the semiconductor device 10 after preparation in accordance with the present disclosure for on-wafer high voltage testing. In a typical wafer fabrication process, a patterning layer 22 is used as a mask for etching vias through the passivation layer 12. Examples of resist materials usable for the patterning layer 22 can be, but are not limited to photoresist, polyimide, polybenzobisoxazole (PBO), and other type polymers. The patterning layer 22 can be relatively thick having a range of around about 1 μm to around about 10 μm. The patterning layer 22 also has a relatively high dielectric strength that is typical of similar materials used in wafer fabrication. A minimum dielectric strength for the patterning layer 22 significantly exceeds the dielectric strength of air, which is around 30 kV/cm. In one embodiment, a lower preferred range for the dielectric strength of the patterning layer 22 is from around about 2000 kV/cm to around about 2500 kV/cm. In another embodiment, a higher preferred range for the dielectric strength of the patterning layer 22 is from around about 4000 kV/cm to around about 5000 kV/cm.

A via 24 is shown etched through the passivation layer 12 to expose the conductive feature 14, which is typically made of metal. Another via 26 is depicted as being etched through the passivation layer 12 to expose the conductive feature 16, which is also typically made of metal. However, it is to be understood that the conductive features 14 and 16 can also be conductive nonmetals such as doped semiconductors.

In accordance with the present disclosure, the patterning layer 22 is left on the passivation layer 12 after via etching to protect the semiconductor device 10 from destructive air ionization and flashover during high voltage electrical testing. A wafer (not shown) typically includes a plurality of the semiconductor device 10. High voltage testing is typically conducted on each of a plurality of semiconductor devices 10 before the patterning layer 22 is removed from the passivation layer 12.

Figure 4:
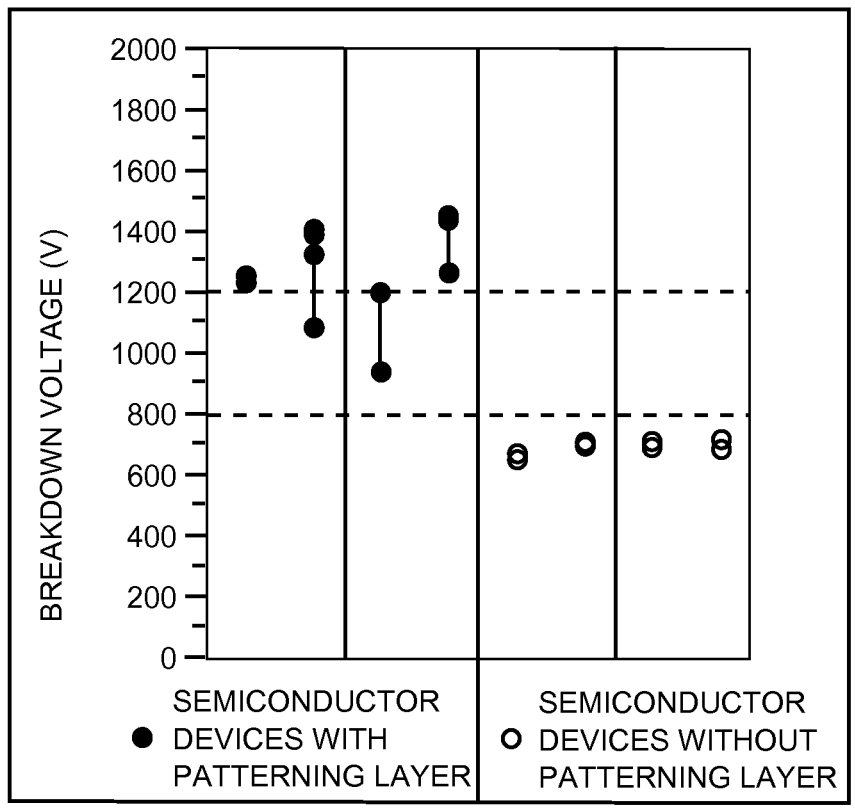
FIG. 4 is a graph depicting breakdown voltage tests of semiconductor devices having and not having a patterning layer.

FIG. 4 is a graph depicting the breakdown voltage of the plurality of semiconductor devices 10 tested with and without the patterning layer 22 (FIG. 3). In the particular electrical tests conducted to produce the data shown in FIG. 4, gallium nitride (GaN) high electron mobility transistors (HEMTs) made up the plurality of semiconductor devices 10. Each of the plurality of semiconductor devices 10 electrically tested included a 0.2 μm silicon nitride (SiN) passivation layer 12 deposited over conductive features 14 and 16 that in this case were top metal layers used for electrical probing and wire bonding.

Figure 1:
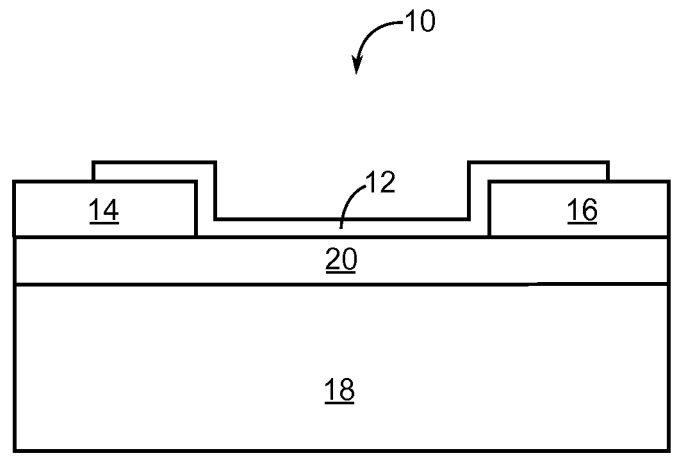
FIG. 1 is a cross-section diagram of a prior art semiconductor device that is subject to destruction during high voltage testing.
Figure 2:
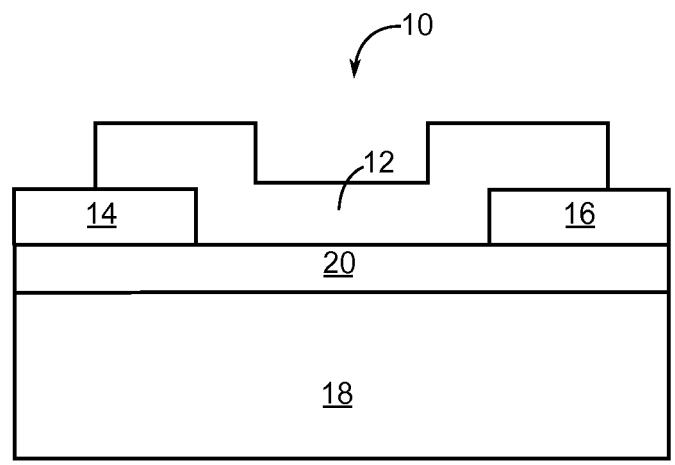
FIG. 2 is a cross-section diagram of the prior art semiconductor device having a thicker passivation layer for increasing the breakdown voltage between adjacent conductive features.

Data points designated by the filled circles represent the breakdown voltage experienced by semiconductor devices tested with the patterning layer 22 added to the passivation layer 12 (FIGS. 1 and 3). Data points designated by open circles represent the breakdown voltage experienced by semiconductor devices tested without the patterning layer 22. Notice that the semiconductor devices tested without the patterning layer 22 experienced a breakdown voltage of around about 700 V due to air ionization. In contrast, the semiconductor devices tested with the patterning layer 22 experienced breakdown voltages that were considerably higher, including breakdown voltages up to around about 1400 V. In all, the semiconductor devices tested with the patterning layer 22 experienced breakdown voltages that ranged from around about 900 V to around about 1400 V.

Figure 5:
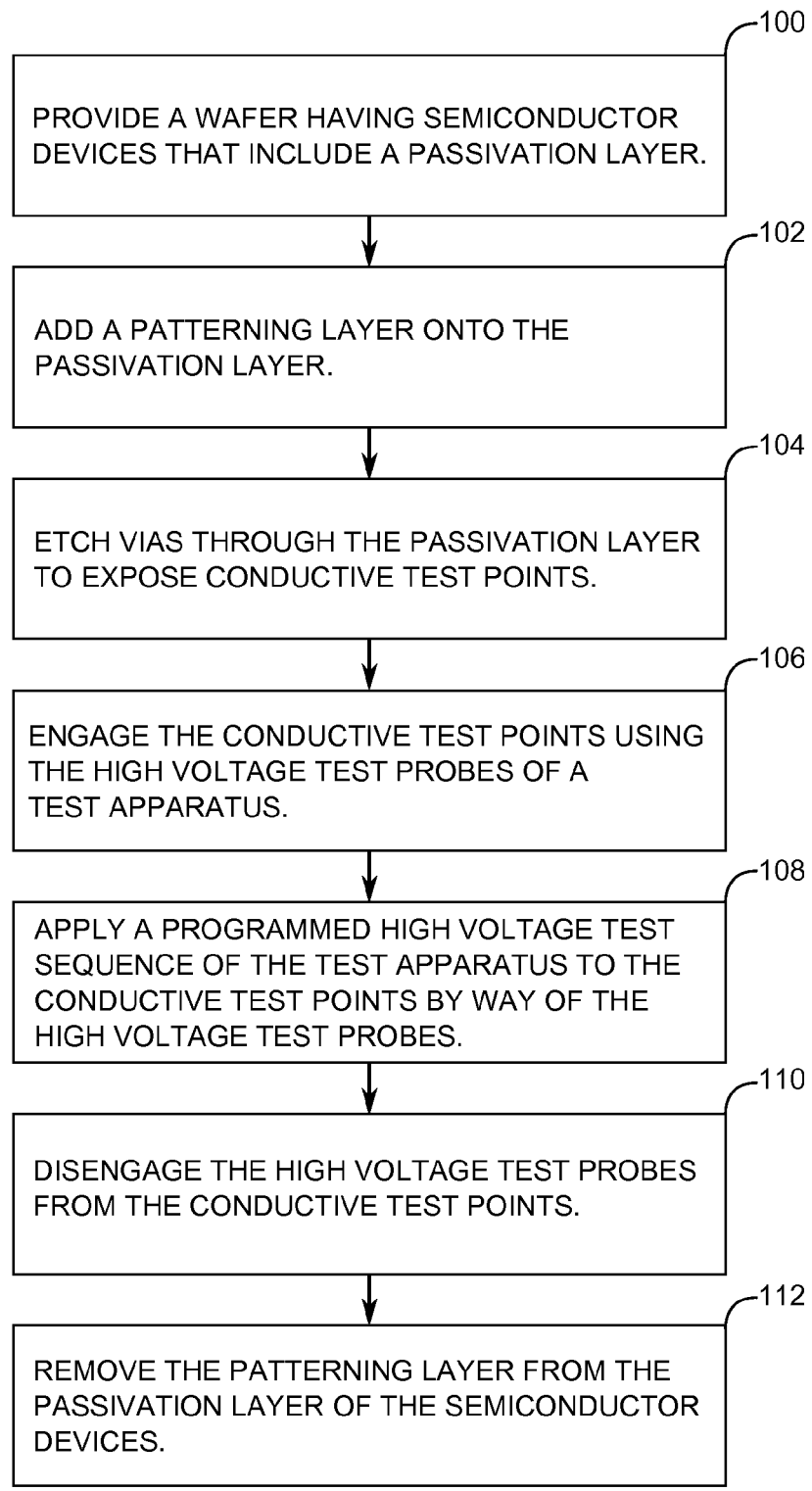
FIG. 5 is a flow chart of method steps for conducting high voltage testing of a semiconductor device in accordance with the present disclosure.

FIG. 5 is a flow chart of method steps for conducting on-wafer high voltage testing of semiconductor devices in accordance with the present disclosure. The method steps begin by providing a wafer having semiconductor devices that include a passivation layer (step 100). A next step adds a patterning layer onto the passivation layer (step 102). Vias are then etched through the passivation layer to expose conductive test points (step 104). Next, the conductive test points are engaged with high voltage test probes of a test apparatus (step 106). A programmed high voltage test sequence of the test apparatus is then applied to the conductive test points by way of the high voltage test probes (step 108). Yet another step disengages the high voltage test probes from a last one of the semiconductor devices being tested (step 110). The process ends with the removal of the patterning layer from the passivation layer of the semiconductor devices (step 112). The patterning layer 22 can be removed by any number of techniques known to those skilled in the art. For example, a common technique for removing the patterning layer 22 is by chemical etching. Other techniques such as mechanical etching may also be employed.

Those skilled in the art will recognize improvements and modifications to the embodiments of the present disclosure. All such improvements and modifications are considered within the scope of the concepts disclosed herein and the claims that follow.

What is claimed is:
1. A method for on-wafer high voltage testing of semiconductor devices comprising:
   providing a wafer having a plurality of semiconductor devices that include a passivation layer disposed over a plurality of conductive test points;
   adding a patterning layer onto the passivation layer;
   etching vias through the passivation layer to expose the plurality of conductive test points;
   providing an automated test apparatus having high voltage test probes;

engaging the plurality of conductive test points through the vias using the high voltage test probes;

applying a high voltage test to the plurality of conductive test points by way of the high voltage test probes;

disengaging the high voltage test probes from the plurality of conductive test points; and removing the patterning layer from the passivation layer of the semiconductor devices.

2. The method of claim 1 wherein the patterning layer is made of a polymer.

3. The method of claim 2 wherein the polymer is polyimide.

4. The method of claim 2 wherein the polymer is polybenzobisoxazole (PBO).

5. The method of claim 1 wherein the patterning layer is made of photoresist.

6. The method of claim 1 wherein the patterning layer has a thickness that ranges from around about 1 μm to around about 5 μm.

7. The method of claim 1 wherein the patterning layer has a thickness that ranges from around about 5 μm to around about 10 μm.

8. The method of claim 1 wherein a dielectric strength of the patterning layer ranges from around about 2000 kV/cm to around about 2500 kV/cm.

9. The method of claim 1 wherein a dielectric strength of the patterning layer ranges from around about 4000 kV/cm to around about 5000 kV/cm.

10. The method of claim 1 wherein the step of applying a high voltage test energizes the high voltage test probes to a voltage that ranges from around about 600 V to around about 1600 V.

11. The method of claim 1 wherein the step of applying a high voltage test energizes the high voltage test probes to a voltage that ranges from around about 800 V to around about 2000 V.

12. The method of claim 1 wherein the automated test apparatus is programmed to provide a high voltage test sequence that records predetermined electrical parameters associated with the plurality of semiconductor devices.

13. The method of claim 1 wherein the plurality of semiconductor devices are gallium nitride (GaN) high electron mobility transistors (HEMTs).

14. The method of claim 13 wherein the passivation layer has a thickness of around about 0.2 μm.

15. The method of claim 13 wherein the passivation layer is made up of silicon nitride (SiN).

16. The method of claim 1 wherein the passivation layer ranges in thickness from around about 0.2 μm to around about 0.3 μm.

17. The method of claim 1 wherein the passivation layer ranges in thickness from around about 0.8 μm to around about 1.2 μm.

18. The method of claim 1 wherein removing the patterning layer from the passivation layer is accomplished using chemical etching.

19. The method of claim 1 wherein removing the patterning layer from the passivation layer is accomplished at least in part using mechanical etching.

20. The method of claim 1 wherein the conductive test points are located on metal layers that are exposed by the vias.

\* \* \* \* \*